(12) United States Patent
Nakajima et al.

(10) Patent No.: US 11,309,686 B2
(45) Date of Patent: Apr. 19, 2022

(54) SURFACE EMITTING LASER AND METHOD OF MANUFACTURING THE SAME

(71) Applicant: SONY CORPORATION, Tokyo (JP)

(72) Inventors: Hiroshi Nakajima, Kanagawa (JP); Tatsushi Hamaguchi, Kanagawa (JP); Jugo Mitomo, Kanagawa (JP); Susumu Sato, Kanagawa (JP); Masamichi Ito, Miyagi (JP); Hidekazu Kawanishi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 178 days.

(21) Appl. No.: 16/621,807

(22) PCT Filed: Apr. 17, 2018

(86) PCT No.: PCT/JP2018/015813
§ 371 (c)(1),
(2) Date: Dec. 12, 2019

(87) PCT Pub. No.: WO2018/235413
PCT Pub. Date: Dec. 27, 2018

(65) Prior Publication Data
US 2020/0176952 A1    Jun. 4, 2020

(30) Foreign Application Priority Data
Jun. 20, 2017    (JP) .............................. JP2017-120071

(51) Int. Cl.
*H01S 5/042*    (2006.01)
*H01S 5/02*    (2006.01)
(Continued)

(52) U.S. Cl.
CPC .......... *H01S 5/18369* (2013.01); *H01S 5/021* (2013.01); *H01S 5/0213* (2013.01);
(Continued)

(58) Field of Classification Search
CPC ............ H01S 5/18369; H01S 5/04257; H01S 5/04253; H01S 5/021; H01S 5/0213;
(Continued)

(56) References Cited

U.S. PATENT DOCUMENTS 6,233,267 B1    5/2001  Nurmikko et al.
2001/0032975 A1*  10/2001  Yamaguchi ........... H01L 33/007
                                                       257/13
(Continued)

FOREIGN PATENT DOCUMENTS

CN          1922772 A     2/2007
CN        102822998 A    12/2012
(Continued)

OTHER PUBLICATIONS

Machine translation of WO2015194243 (Year: 2015).*
(Continued)

*Primary Examiner* — Yuanda Zhang
(74) *Attorney, Agent, or Firm* — Chip Law Group

(57) ABSTRACT

A surface emitting laser includes: a semiconductor layer containing a nitride semiconductor, and including a first semiconductor layer, an active layer, and a second semiconductor layer that are stacked in this order, in which the semiconductor layer includes a light emitting region; and a first light reflecting layer and a second light reflecting layer that are opposed to each other with the semiconductor layer being disposed therebetween. The first semiconductor layer has a high dislocation portion disposed outside the light emitting region. The high dislocation portion has an average dislocation density higher than an average dislocation density of the light emitting region.

19 Claims, 6 Drawing Sheets

(51) Int. Cl.
  *H01S 5/183* (2006.01)
  *H01S 5/30* (2006.01)
  *H01S 5/343* (2006.01)

(52) U.S. Cl.
  CPC ........ *H01S 5/0217* (2013.01); *H01S 5/04253* (2019.08); *H01S 5/04257* (2019.08); *H01S 5/3063* (2013.01); *H01S 5/34333* (2013.01); *H01S 2301/173* (2013.01); *H01S 2304/04* (2013.01)

(58) Field of Classification Search
  CPC .. H01S 5/0217; H01S 5/3063; H01S 5/34333; H01S 2301/173
  See application file for complete search history.

(56) References Cited

U.S. PATENT DOCUMENTS

| | | |
|---|---|---|
| 2008/0272462 A1 | 11/2008 | Shimamoto et al. |
| 2009/0180505 A1 | 7/2009 | Kohda et al. |
| 2012/0205661 A1 | 8/2012 | Kyono et al. |
| 2016/0343903 A1* | 11/2016 | Ueta ................... H01L 33/16 |
| 2017/0201073 A1 | 7/2017 | Futagawa et al. |

FOREIGN PATENT DOCUMENTS

| | | |
|---|---|---|
| CN | 106663919 A | 5/2017 |
| EP | 3159983 A1 | 4/2017 |
| JP | 10-308558 A | 11/1998 |
| JP | 2009-164233 A | 7/2009 |
| JP | 2011-029607 A | 2/2011 |
| JP | 2012-169481 A | 9/2012 |
| KR | 10-2012-0114403 A | 10/2012 |
| TW | 201246593 A | 11/2012 |
| WO | 2006/054543 A1 | 5/2006 |
| WO | 2012/111379 A1 | 8/2012 |
| WO | 2015/194243 A1 | 12/2015 |

OTHER PUBLICATIONS

International Search Report and Written Opinion of PCT Application No. PCT/JP2018/015813, dated Jul. 10, 2018, 09 pages of ISRWO.

* cited by examiner

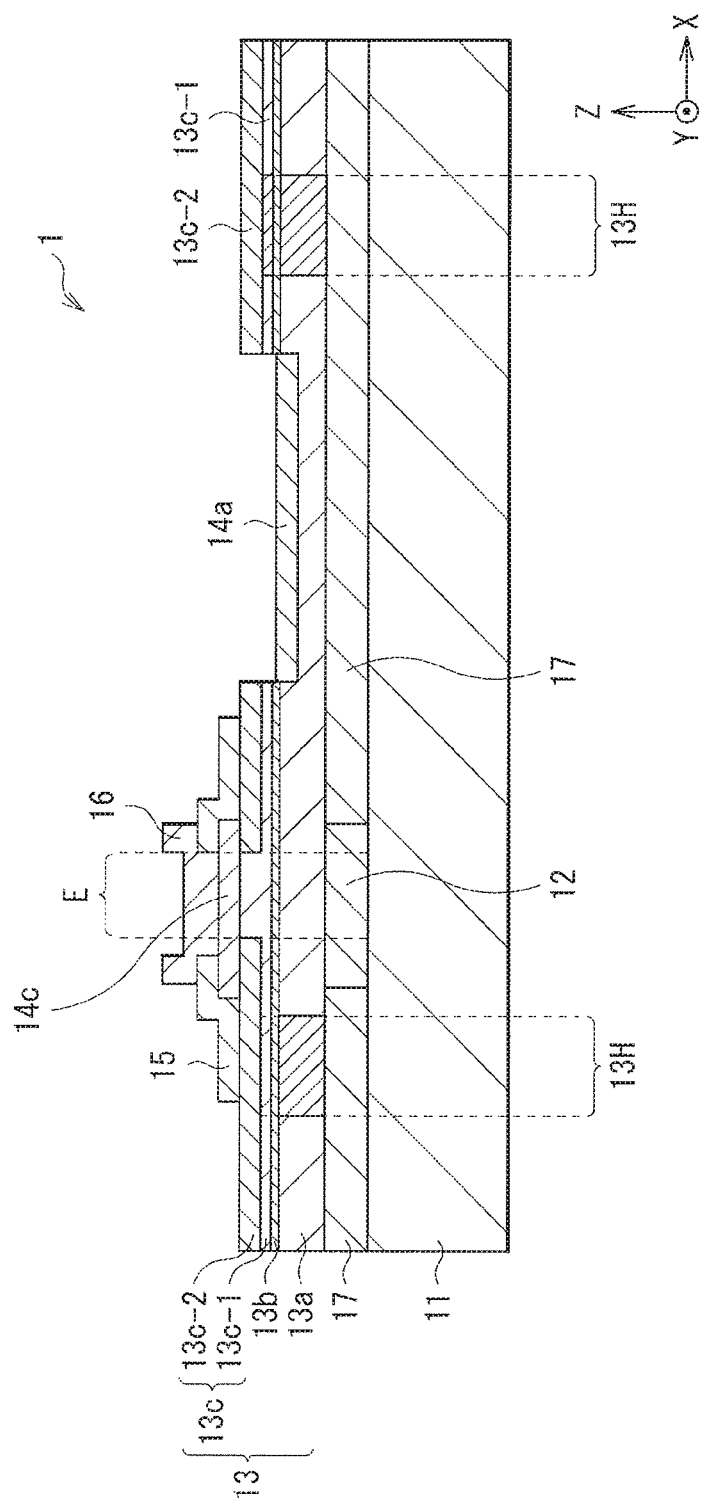
[FIG. 1]

[FIG. 2A]
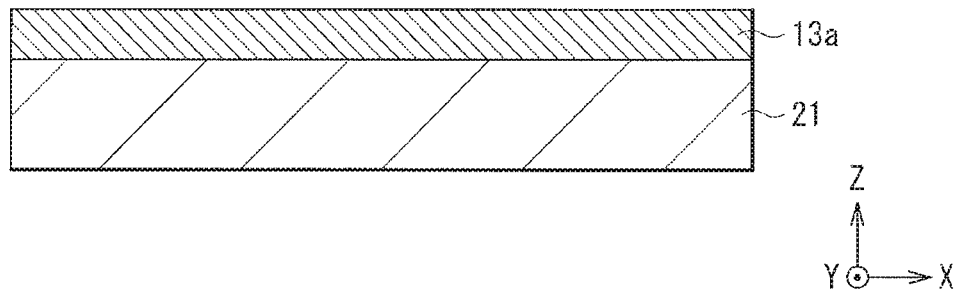
[FIG. 2B]
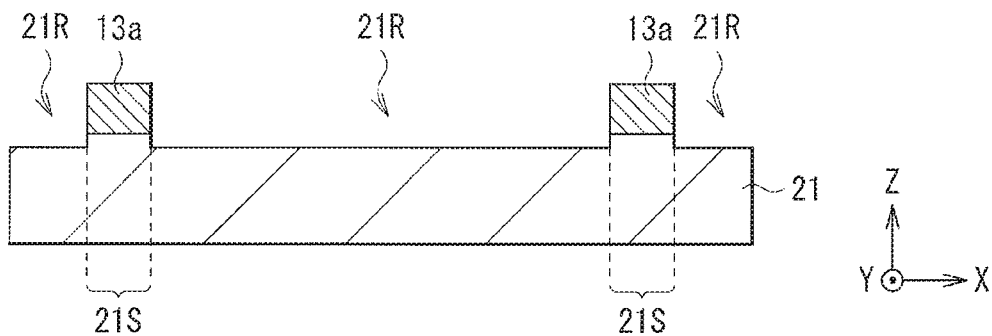
[FIG. 2C]
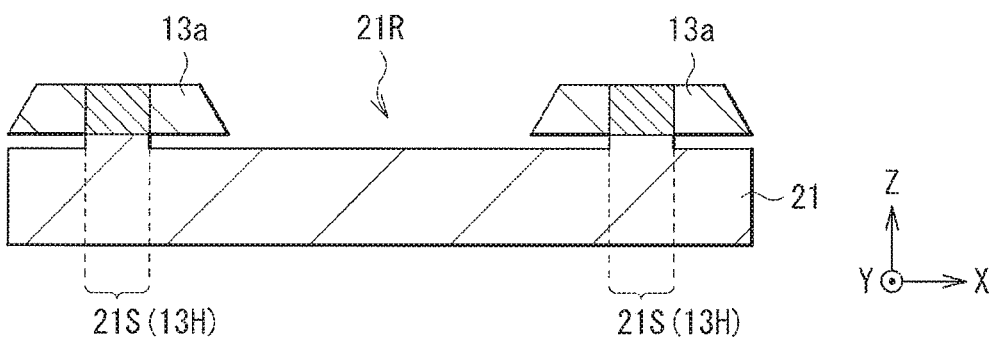
[FIG. 2D]
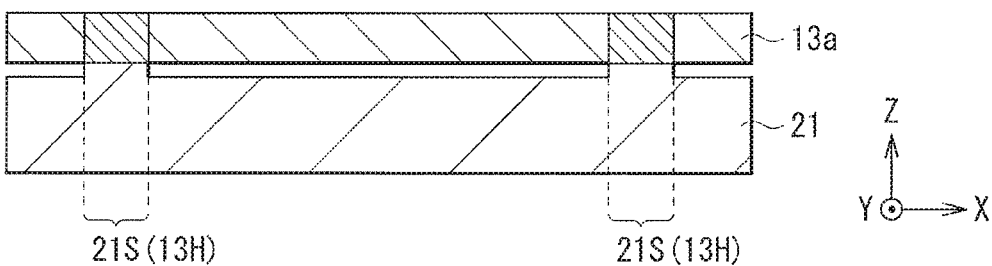

[FIG. 3A]
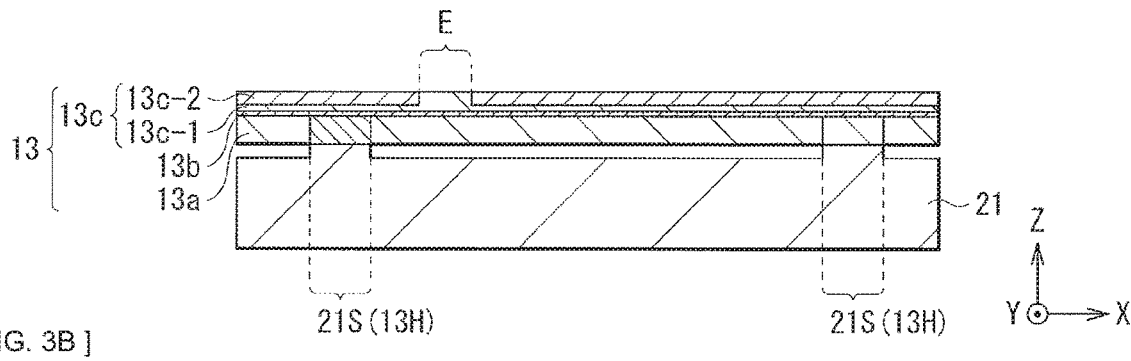
[FIG. 3B]
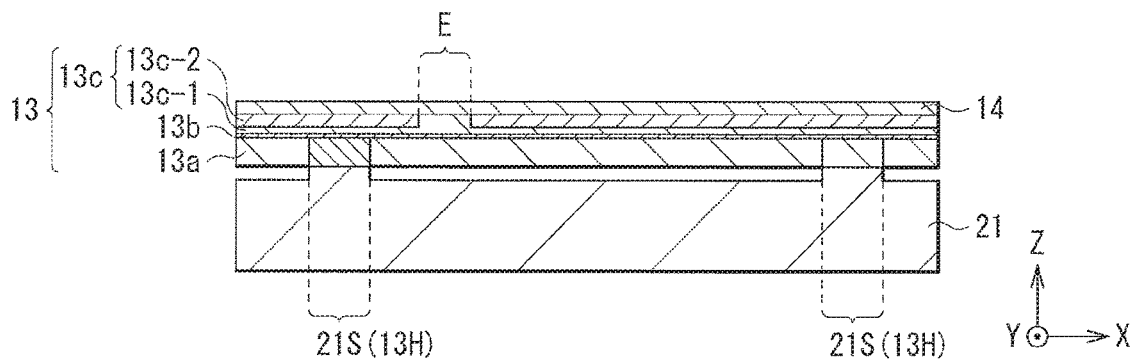
[FIG. 3C]
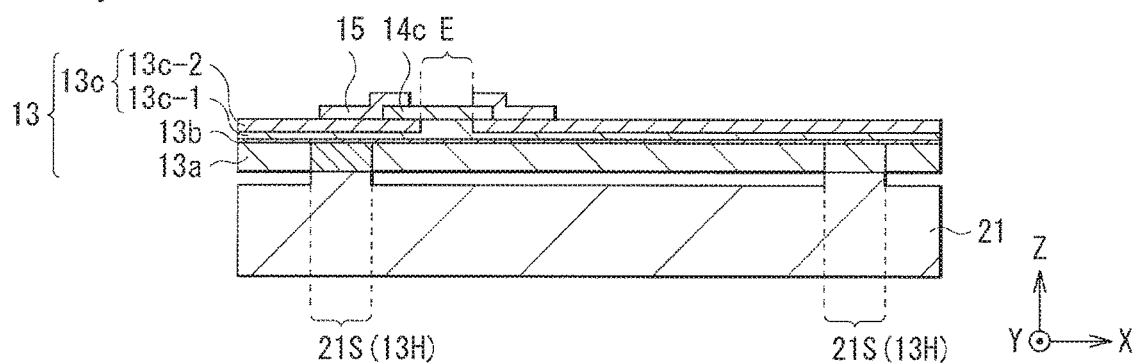
[FIG. 3D]
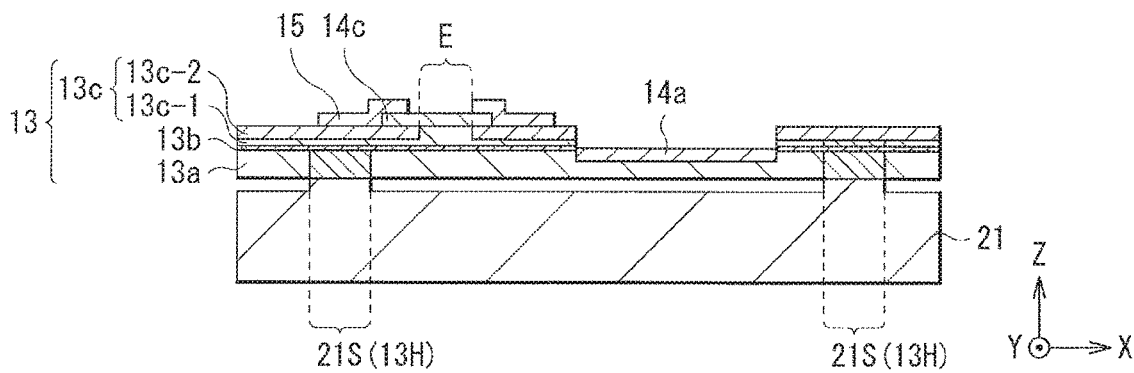

[ FIG. 4A ]
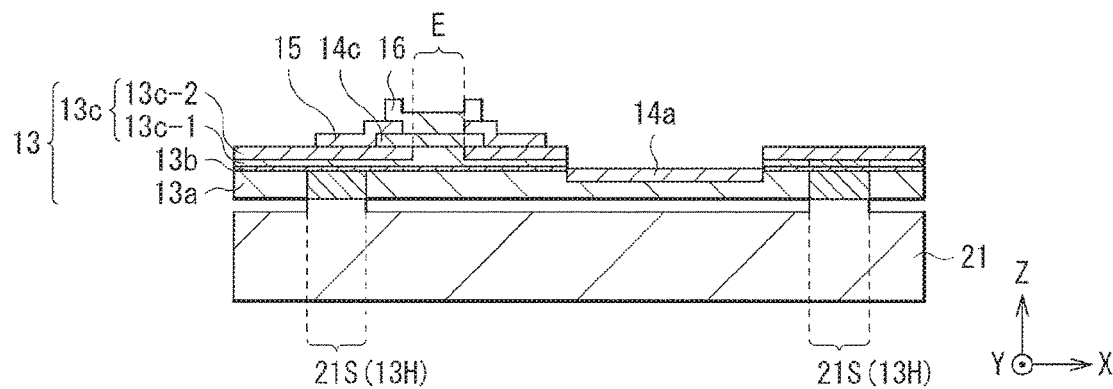
[ FIG. 4B ]
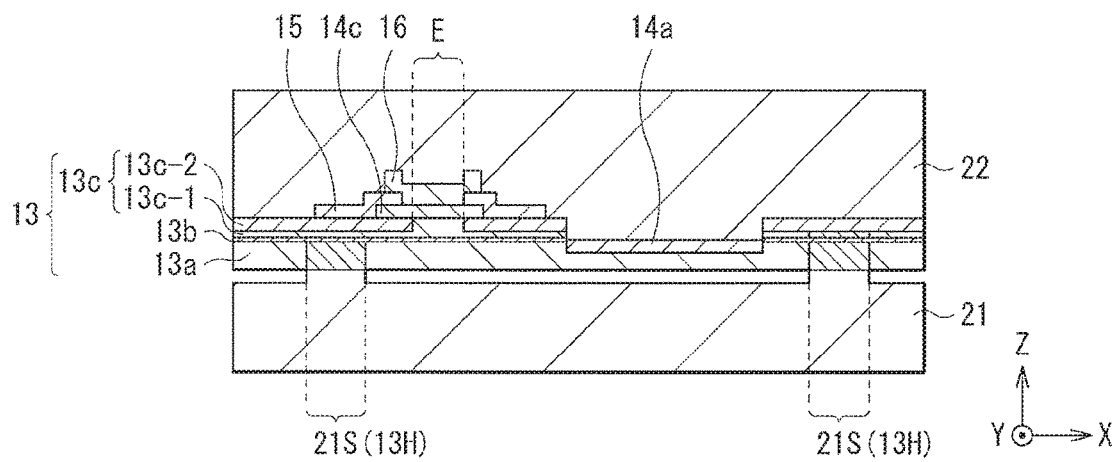
[ FIG. 4C ]
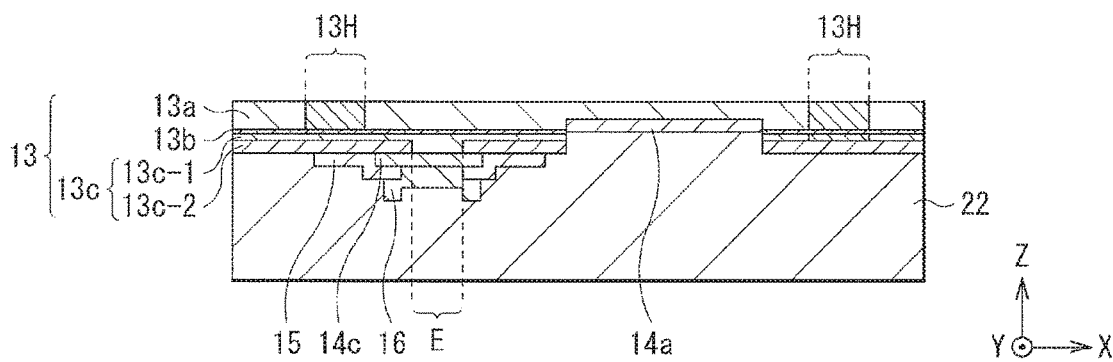

[FIG. 5A]
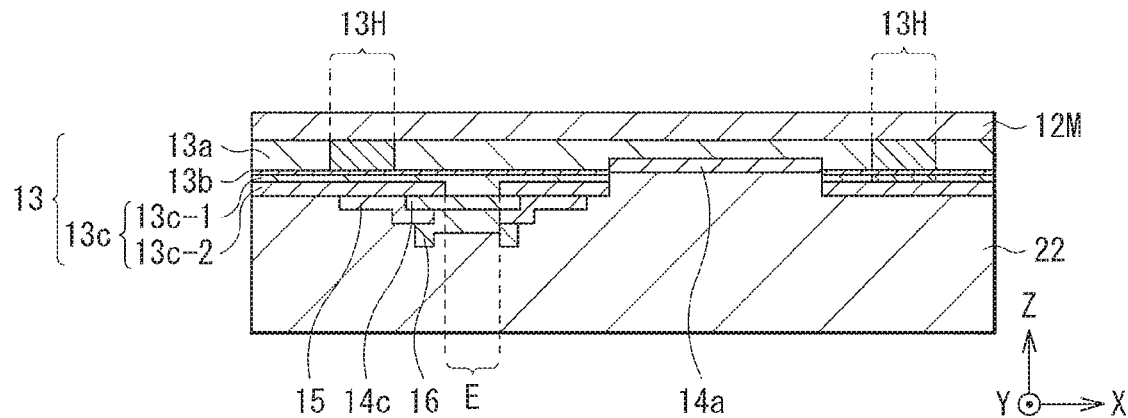
[FIG. 5B]
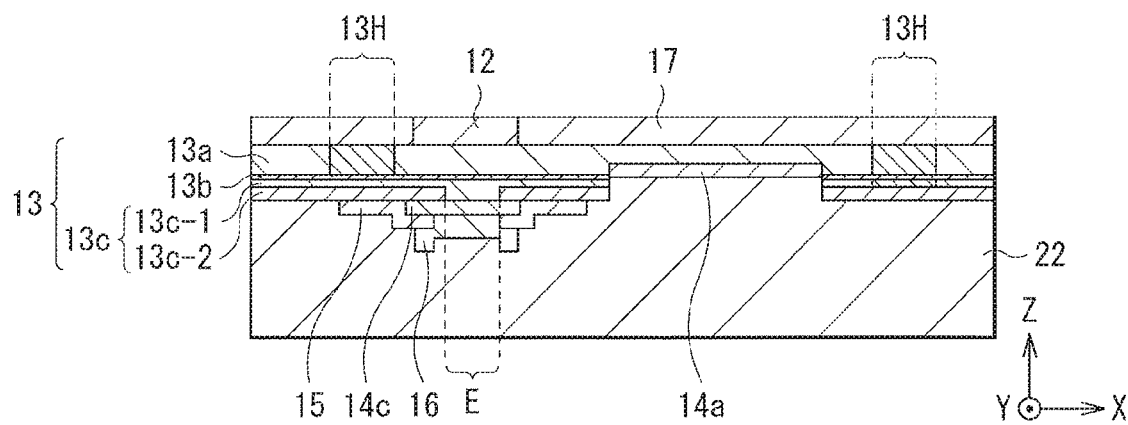
[FIG. 5C]
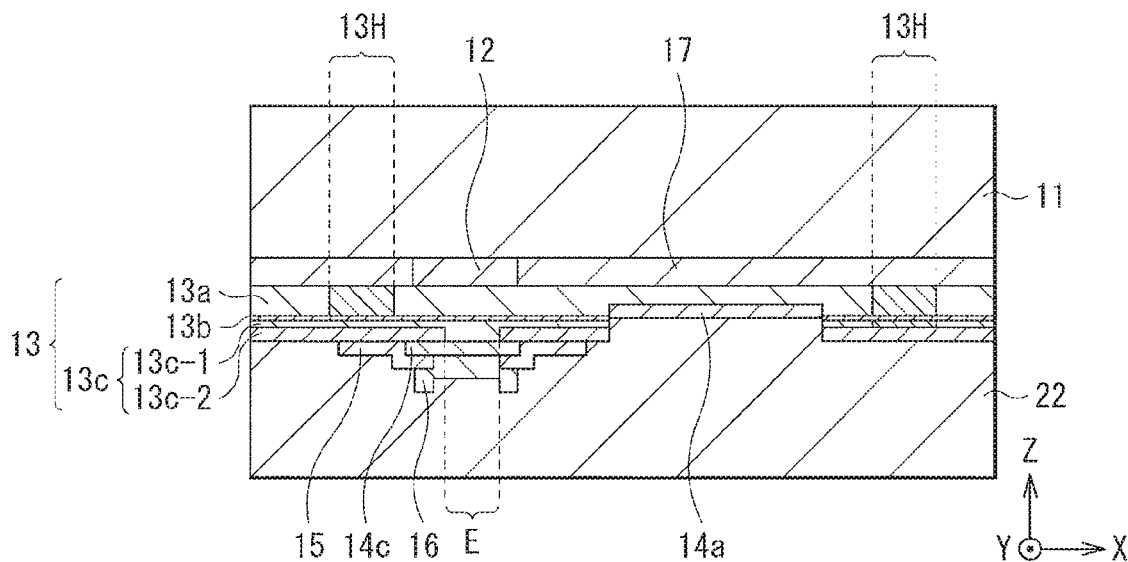

[FIG. 6]
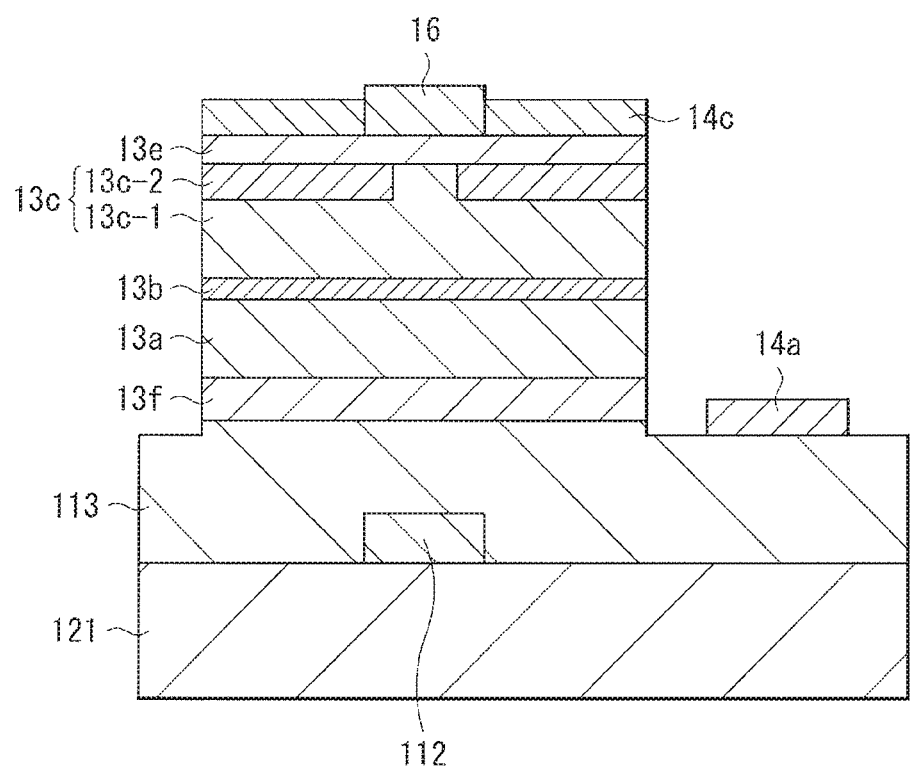

SURFACE EMITTING LASER AND METHOD OF MANUFACTURING THE SAME

CROSS REFERENCE TO RELATED APPLICATIONS

This application is a U.S. National Phase of International Patent Application No. PCT/JP2018/015813 filed on Apr. 17, 2018, which claims priority benefit of Japanese Patent Application No. JP 2017-120071 filed in the Japan Patent Office on Jun. 20, 2017. Each of the above-referenced applications is hereby incorporated herein by reference in its entirety.

TECHNICAL FIELD

The present technology relates to a surface emitting laser containing a nitride semiconductor, and a method of manufacturing the same.

BACKGROUND ART

Development for a surface emitting laser (VCSEL: Vertical Cavity Surface Emitting LASER) containing a nitride semiconductor has been carried on (see, for example, Patent Literature 1). A nitride semiconductor is able to cover the wavelength range from the near-infrared range to the deep ultraviolet range as it has a band gap from about 0.7 eV to 6.2 eV. Thus, the VCSEL containing the nitride semiconductor is able to emit light having a wavelength shorter than that of a compound semiconductor containing, for example, arsenic (As) or phosphorus (P).

CITATION LIST

Patent Literature

Patent Literature 1: Japanese Unexamined Patent Application Publication No. H10-308558

SUMMARY OF THE INVENTION

There is a demand for a surface emitting laser containing a nitride semiconductor to further improve a device characteristic such as reliability.

Thus, it is desirable to provide a surface emitting laser and a method of manufacturing the same, which are able to further improve a device characteristic.

A surface emitting laser according to an embodiment of the present technology includes: a semiconductor layer containing a nitride semiconductor, and including a first semiconductor layer, an active layer, and a second semiconductor layer that are stacked in this order, in which the semiconductor layer includes a light emitting region; and a first light reflecting layer and a second light reflecting layer that are opposed to each other with the semiconductor layer being disposed therebetween. The first semiconductor layer has a high dislocation portion disposed outside the light emitting region. The high dislocation portion has an average dislocation density higher than an average dislocation density of the light emitting region.

According to the surface emitting laser of the embodiment of the present technology, the light emitting region is provided outside the high dislocation portion of the first semiconductor layer. Thus, it is possible to emit light in a manner that substantially does not receive any influence of the high dislocation portion even if the high dislocation portion exists in the first semiconductor layer.

A method of manufacturing a surface emitting laser according to an embodiment of the present technology includes: forming a first semiconductor layer in a seed region selectively provided in a growth substrate; stacking an active layer and a second semiconductor layer in this order on the first semiconductor layer, after causing the first semiconductor layer to grow, from the seed region, in a direction parallel to a plane of the growth substrate; forming a light emitting region outside the seed region; forming a second light reflecting layer that is opposed to the active layer with the second semiconductor layer being disposed therebetween; removing the growth substrate, after bonding a first support substrate to the growth substrate with the second light reflecting layer being disposed therebetween; and forming a first light reflecting layer that is opposed to the second light reflecting layer with the active layer being disposed therebetween.

According to the method of manufacturing the surface emitting laser of the embodiment of the present technology, the light emitting region is provided outside the seed region in the growth substrate. Thus, it is possible to emit light in a manner that does not substantially receive any influence of the seed region even if the first semiconductor layer in the seed region has a high average dislocation density (even if it is a high dislocation portion). For example, the surface emitting laser according to the embodiment of the present technology is manufactured by the method of manufacturing the surface emitting laser according to the embodiment of the present technology.

According to the surface emitting laser of the embodiment of the present technology, the light emitting region is provided outside the high dislocation portion of the first semiconductor layer. In addition, according to the method of manufacturing the surface emitting laser of the embodiment of the present technology, the light emitting region is provided outside the seed region in the growth substrate. Thus, it is possible to suppress the influence of the high dislocation portion or the seed region on the light emitting region. Hence, it is possible to improve a device characteristic such as reliability.

It should be noted that the details described above are merely examples of the present disclosure. The effects of the present disclosure are not limited to those described above, and may be other different effects, or may further include other effects.

BRIEF DESCRIPTION OF THE DRAWINGS

FIG. 1 is a cross-sectional schematic view of a schematic configuration of a laser device according to an embodiment of the present technology.

FIG. 2A is a cross-sectional schematic view of a step in a method of manufacturing the laser device illustrated in FIG. 1.

FIG. 2B is a cross-sectional schematic view of a step subsequent to FIG. 2A.

FIG. 2C is a cross-sectional schematic view of a step subsequent to FIG. 2B.

FIG. 2D is a cross-sectional schematic view of a step subsequent to FIG. 2C.

FIG. 3A is a cross-sectional schematic view of a step subsequent to FIG. 2D.

FIG. 3B is a cross-sectional schematic view of a step subsequent to FIG. 3A.

FIG. 3C is a cross-sectional schematic view of a step subsequent to FIG. 3B.

FIG. 3D is a cross-sectional schematic view of a step subsequent to FIG. 3C.

FIG. 4A is a cross-sectional schematic view of a step subsequent to FIG. 3D.

FIG. 4B is a cross-sectional schematic view of a step subsequent to FIG. 4A.

FIG. 4C is a cross-sectional schematic view of a step subsequent to FIG. 4B.

FIG. 5A is a cross-sectional schematic view of a step subsequent to FIG. 4C.

FIG. 5B is a cross-sectional schematic view of a step subsequent to FIG. 5A.

FIG. 5C is a cross-sectional schematic view of a step subsequent to FIG. 5B.

FIG. 6 is a cross-sectional schematic view of a schematic configuration of a laser device according to a comparative example.

MODES FOR CARRYING OUT THE INVENTION

In the following, embodiments according to the present technology will be described in detail with reference to the drawings.

EMBODIMENTS

FIG. 1 is a diagram schematically illustrating a cross-sectional configuration of a surface emitting laser (laser device 1) according to an embodiment of the present technology. This laser device 1 includes, for example, VCSEL, which includes a light emitting region (light emitting region E) where a first light reflecting layer 12, a semiconductor layer 13, a second electrode 14c, and a second light reflecting layer 16 are stacked in this order on a support substrate 11 (second support substrate). The semiconductor layer 13 includes a first semiconductor layer 13a, an active layer 13b, and a second semiconductor layer 13c provided in an order from the position close to the first light reflecting layer 12. The laser device 1 includes a first electrode 14a electrically coupled to the first semiconductor layer 13a, and a pad electrode 15 electrically coupled to the second electrode 14c. The first light reflecting layer 12 is provided in a selective region on the support substrate 11. A metal layer 17 is disposed between the support substrate 11 and the first semiconductor layer 13a and in a region where the first light reflecting layer 12 is not provided.

The support substrate 11 includes, for example, a silicon (Si) substrate.

The first light reflecting layer 12 on the support substrate 11 includes DBR (Distributed Bragg Reflector) disposed on the first semiconductor layer 13a side, and is provided in a selective region containing the light emitting region E. The first light reflecting layer 12 is opposed to the active layer 13b with the first semiconductor layer 13a being disposed therebetween. The first light reflecting layer 12 in conjunction with the second light reflecting layer 16 oscillates the light generated in the active layer 13b.

A dielectric material configuring the first light reflecting layer 12 includes oxide, nitrides, or fluoride containing, for example, silicon (Si), magnesium (Mg), aluminum (Al), hafnium (Hf), niobium (Nb), zirconium (Zr), scandium (Sc), tantalum (Ta), gallium (Ga), zinc (Zn), yttrium (Y), boron (B), and titanium (Ti). Specifically, examples include silicon oxide ($SiO_2$), titanium oxide ($TiO_2$), niobium oxide ($Nb_2O_5$), zirconium oxide ($ZrO_2$), tantalum oxide ($Ta_2O_5$), zinc oxide (ZnO), aluminium oxide ($Al_2O_3$), hafnium oxide ($HfO_2$), and aluminum nitride (AlN). Of these dielectric materials, two or more types of dielectric materials having different indices of refraction are selected, and are alternately stacked, thereby being able to configure the first light reflecting layer 12. The first light reflecting layer 12 includes, for example, a dielectric multilayer film such as silicon oxide ($SiO_2$)/tantalum oxide ($Ta_2O_5$). The number of stacks (the number of pairs) described above is, for example, 14. It is only necessary to adjust a dielectric material, the thickness thereof, the number of stacks, or the like so as to be able to obtain a desired reflectivity. The first light reflecting layer 12 may include a semiconductor multilayer film.

For example, the metal layer 17 is provided on the same layer as the first light reflecting layer 12 on the support substrate 11. The metal layer 17 surrounds the first light reflecting layer 12 in plan view (when viewed from a plane parallel to a plane of the support substrate 11, for example, when viewed from the X-Y plane in FIG. 1). This metal layer 17 has a thickness same as that of the first light reflecting layer 12. It is preferable that heat be efficiently dissipated from the first semiconductor layer 13a through the metal layer 17 to the support substrate 11. The metal layer 17 includes, for example, nickel (Ni). For the metal layer 17, it may be possible to use, for example, gold (Au), silver (Ag), tin (Sn), titanium (Ti), and platinum (Pt). The metal layer 17 may include any one of these metals, or may include an alloy thereof. The metal layer 17 may have a stacked structure.

The semiconductor layer 13 includes a nitride-based semiconductor material such as InGaAlN-based one or the like, and, for example, generates light having a wavelength in an ultraviolet range or in a visible range. Specifically, the nitride-based semiconductor material such as InGaAlN-based one includes gallium nitride (GaN), gallium aluminum nitride (GaAlN), indium gallium nitride (InGaN), and indium gallium aluminum nitride (InGaAlN). For example, the first semiconductor layer 13a includes n-type GaN. The active layer 13b includes InGaN. The second semiconductor layer 13c includes p-type GaN. The first semiconductor layer 13a contains, for example, silicon (Si) as an n-type impurity. The second semiconductor layer 13c contains, for example, magnesium (Mg) as a p-type impurity. The active layer 13b may have a quantum well structure. The active layer 13b having the quantum well structure has a stacked structure including a well layer and a barrier layer. As described below, this semiconductor layer 13 is formed, for example, on a growth substrate (growth substrate 21 in FIG. 2A, which will be described later) such as a sapphire substrate using an epitaxial growth method. It is preferable that the semiconductor layer 13 have a thickness (the size in the Z direction in FIG. 1) of 10 µm or less, and for example, of a thickness of 5 µm. More specifically, the sum of thicknesses of the first semiconductor layer 13a, the active layer 13b, and the second semiconductor layer 13c is 10 µm or less. With the semiconductor layer 13 having a thickness of 10 µm or less, it is possible to suppress occurrence of diffraction loss resulting from expansion of light.

The first semiconductor layer 13a is, for example, provided over the entire surface of the support substrate 11 through the first light reflecting layer 12 or the metal layer 17. In the present embodiment, this first semiconductor layer 13a has a region (high dislocation portion 13H) having an average dislocation density higher than the average dislocation density of the light emitting region E, the region being disposed outside the light emitting region E in plan view (when viewed from a plane parallel to a plane of the support substrate 11, for example, when viewed from the X-Y plane in FIG. 1). In other words, in the light emitting region E, the first semiconductor layer 13a has the average dislocation density lower than the average dislocation density of the high dislocation portion 13H. This makes it possible to improve a device characteristic of the laser device 1.

The high dislocation portion 13H of the first semiconductor layer 13a extends, for example, in one direction with a predetermined width. That is, the high dislocation portion 13H has a band-like planar shape. A plurality of the high dislocation portions 13H is disposed in the first semiconductor layer 13a at predetermined intervals in a stripe manner (two high dislocation portions 13H are illustrated in FIG. 1). The high dislocation portion 13H is a first semiconductor layer 13a provided in a seed region (seed region 21S in FIG. 2B described later) of a growth substrate (growth substrate 21 in FIG. 2A described later), as described later. The high dislocation portion 13H has an average dislocation density of, for example, $1 \times 10^9$ cm$^{-2}$. The first semiconductor layer 13a in the light emitting region E has an average dislocation density of, for example, about $5 \times 10^6$ cm$^{-2}$. As described later, the dislocation in the seed region is provided so as to penetrate through in the vertical direction. Thus, the average dislocation densities of the active layer 13b and the second semiconductor layer 13c that overlap with the high dislocation portion 13H, for example, in plan view are higher than the average dislocation densities of other portions.

Emission of light is performed in the active layer 13b disposed between the first semiconductor layer 13a and the second semiconductor layer 13c with application of a predetermined voltage across the first electrode 14a and the second electrode 14c. The second semiconductor layer 13c that is opposed to the first semiconductor layer 13a is disposed between the active layer 13b and the second electrode 14c, and includes a first portion 13c-1 and a second portion 13c-2. The first portion 13c-1 faces the light emitting region E, and is provided throughout the entire thickness direction of the second semiconductor layer 13c. The second portion 13c-2 is provided to narrow the area for an electric current to flow from the second electrode 14c through the second semiconductor layer 13c (current confining), and has an electric resistance higher than that of the first portion 13c-1. With this second portion 13c-2 being provided, electric current is concentrated and flows through the first portion 13c-1. In other words, the shape of the light emitting region E is defined by the shape of the opening of the second portion 13c-2, namely, the shape of the first portion 13c-1. The second portion 13c-2 surrounds the first portion 13c-1 in plan view, and is provided in a portion of the second semiconductor layer 13c in the thickness direction from the surface thereof on the second electrode 14c side. The second portion 13c-2 may be provided throughout the entire thickness direction of the second semiconductor layer 13c. The second portion 13c-2 includes a p-type GaN having a resistance increased, for example, through implantation of boron (B) ion. The second portion 13c-2 may have an insulating property. A current confining layer may be provided separately from the second semiconductor layer 13c. Alternatively, it is possible to confine current without the second portion 13c-2 being provided. For example, current may be confined using a mesa structure of the second semiconductor layer 13c. The active layer 13b and the second semiconductor layer 13c each have an opening at respective positions that overlap with each other in plan view. The first semiconductor layer 13a is exposed at this opening. The first electrode 14a is in contact with the first semiconductor layer 13a at this exposed portion.

The light emitting region E is provided at a position spaced apart from the high dislocation portion 13H of the first semiconductor layer 13a in plan view. The planar shape of the light emitting region E is, for example, a circle with a diameter of 8 μm. The light emitting region E may have any planar shape, and may be, for example, an ellipse, triangle, quadrilateral, hexagon, or the like.

The first electrode 14a is provided to apply a voltage to the active layer 13b through the first semiconductor layer 13a, and is provided on the support substrate 11 with the metal layer 17 and the first semiconductor layer 13a being disposed therebetween. The first electrode 14a is disposed at a position that is positionally shifted from the light emitting region E in plan view. The first electrode 14a include, for example, a film of metal such as gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In). The first electrode 14a may include a single layer of the metal film, or may include a metal film with a stacked structure. The first electrode 14a may include an electrically conductive material other than metal.

The second electrode 14c is provided in a selective region on the second semiconductor layer 13c, and is electrically coupled to the first portion 13c-1. This second electrode 14c is provided to apply a voltage to the active layer 13b through the second semiconductor layer 13c. The second electrode 14c includes, for example, an electrically conductive and light-transmissive material (transparent conductive material), and is provided in a region containing the light emitting region E in plan view. The transparent conductive material that configures the second electrode 14c includes, for example, indium-tin oxide (ITO: Indium Tin Oxide), indium-zinc oxide (IZO: Indium Zinc Oxide), fluorine (F)-doped indium oxide ($In_2O_3$), tin oxide ($SnO_2$), antimony (Sb)-doped tin oxide ($SnO_2$), fluorine (F)-doped tin oxide ($SnO_2$), zinc oxide (ZnO), or the like. The second electrode 14c may include a transparent conductive material including gallium oxide, titanium oxide, niobium oxide, nickel oxide or the like as a base layer.

The pad electrode 15 is provided from above the second electrode 14c to above the second semiconductor layer 13c, and covers an end portion of the second electrode 14c. This pad electrode 15 has an opening that allows the second electrode 14c in the light emitting region E to be exposed. This pad electrode 15 is provided to electrically couple the laser device 1 to an external electrode or circuit. The pad electrode 15 includes, for example, a metal such as titanium (Ti), aluminum (Al), platinum (Pt), gold (Au), nickel (Ni), and palladium (Pd). The pad electrode 15 may include a single layer of metal film, or may include a metal film having a stacked structure.

The second light reflecting layer 16 is DBR disposed on the second semiconductor layer 13c side, and is provided in a selective region containing the light emitting region E. This second light reflecting layer 16 is opposed to the first light reflecting layer 12 with the semiconductor layer 13 and the second electrode 14c being disposed therebetween. As for the dielectric material that configures the second light reflecting layer 16, it is possible to use oxide, nitride, or fluoride containing, for example, silicon (Si), magnesium (Mg), aluminum (Al), hafnium (Hf), niobium (Nb), zirconium (Zr), scandium (Sc), tantalum (Ta), gallium (Ga), zinc (Zn), yttrium (Y), boron (B), and titanium (Ti). Specifically, examples include silicon oxide (SiO$_2$), titanium oxide (TiO$_2$), niobium oxide (Nb$_2$O$_5$), zirconium oxide (ZrO$_2$), tantalum oxide (Ta$_2$O$_5$), zinc oxide (ZnO), aluminium oxide (Al$_2$O$_3$), hafnium oxide (HfO$_2$), and aluminum nitride (AlN). Of these dielectric materials, two or more types of dielectric materials having different indices of refraction are selected, and are alternately stacked, thereby being able to configure the second light reflecting layer 16. The second light reflecting layer 16 includes, for example, a dielectric multilayer film such as silicon oxide (SiO$_2$)/tantalum oxide (Ta$_2$O$_5$). The number of stacks (the number of pairs) is, for example, 11.5. It is only necessary to adjust a dielectric material, the thickness thereof, the number of stacks, or the like so as to be able to obtain a desired reflectivity. The second light reflecting layer 16 may include a semiconductor multilayer film.

Such a laser device 1 is able to be manufactured in the following manner through a lateral growth technique using a seed crystal, the technique being disclosed, for example, in Japanese Unexamined Patent Application Publication (Published Japanese Translation of PCT Application) No. 2003-514392 (FIGS. 2A, 2B, 2C, 2D, 3A, 3B, 3C, 3D, 4A, 4B, 4C, 5A, 5B, and 5C).

First, the first semiconductor layer 13a having a thickness of 2 μm is formed in the form of film on the growth substrate 21 through a low-temperature buffer layer (not illustrated) having, for example, a thickness of 50 nm, as illustrated in FIG. 2A. It is possible to use, for example, a c-plane sapphire substrate for the growth substrate 21. The low-temperature buffer layer and the first semiconductor layer 13a are formed throughout the entire surface of the growth substrate 21 using, for example, metal organic chemical vapor deposition (MOCVD: Metal Organic Chemical Vapor Deposition). The growth temperature for the low-temperature buffer layer is, for example, 600° C. The growth temperature for the first semiconductor layer 13a is, for example, 1000° C. For example, a film of gallium nitride (GaN) is formed as the low-temperature buffer layer. For example, a film of gallium nitride (GaN) is formed as the first semiconductor layer 13a. At this time, the average dislocation density of the first semiconductor layer 13a is, for example, about 1×10$^9$ cm$^{-2}$.

After the first semiconductor layer 13a is formed in the form of film on the growth substrate 21, a portion of this first semiconductor layer 13a is removed so that the first semiconductor layer 13a only remains in a selective region (seed region 21S) of the growth substrate 21, as illustrated in FIG. 2B. This first semiconductor layer 13a remaining in the seed region 21S functions as a seed crystal. The planar shape of the seed region 21S is, for example, a band shape that extends in a predetermined direction (in the Y direction in FIG. 2B). In addition, a plurality of seed regions 21S is arranged at predetermined intervals with each other. That is, the seed regions 21S are arranged in a strip manner. The extending direction (Y direction in FIG. 2B) of the seed region 21S is, for example, in parallel to the <1-100> direction. The width (the size in the X direction in FIG. 2B) of the seed region 21S is, for example, 3 μm. The interval (the distance in the X direction in FIG. 2B) between adjacent seed regions 21S is, for example, 30 μm. For example, dry etching is performed to a portion of the first semiconductor layer 13a. At the time of performing etching to the first semiconductor layer 13a, etching is also performed to a portion of the growth substrate 21. This forms a recessed portion 21R between seed regions 21S of the growth substrate 21. The depth (the distance in the Z direction in FIG. 2B) of the recessed portion 21R is, for example, 0.1 μm. The first semiconductor layer 13a after etching may contain silicon (Si) as an n-type impurity.

After etching is performed to the first semiconductor layer 13a and the growth substrate 21, the first semiconductor layer 13a in the seed region 21S is caused to grow in a direction (in a lateral direction) parallel to a substrate surface of the growth substrate 21 through an ELO (Epitaxial Lateral Overgrowth) method, as illustrated in FIGS. 2C and 2D. Preferably, condistions are selected so as to facilitate the growth in the lateral direction. For example, the growth temperature is set to be high, and the growth rate is set to be low. The growth temperature is, for example, 1070° C. The growth rate is, for example, 1 μm/h. Here, the growth substrate 21 includes the recessed portion 21R. Thus, the first semiconductor layer 13a so grows as to be spaced apart from the growth substrate 21. In other words, a space exists between the first semiconductor layer 13a (first semiconductor layer 13a other than the seed region 21S) that has grown up and the growth substrate 21. Because the dislocation extends mainly in a direction perpendicular to the substrate surface (in the vertical direction), a portion of the first semiconductor layer 13a other than the seed region 21S has a low average dislocation density of, for example, about 5×10$^6$ cm$^{-2}$. The first semiconductor layer 13a in the seed region 21S serves as the high dislocation portion 13H.

FIG. 2D illustrates an example in which first semiconductor layers 13a that are caused to grow from adjacent seed regions 21S are integrated with each other. However, first semiconductor layers 13a that are caused to grow from adjacent seed regions 21S may be separated from each other.

After the first semiconductor layer 13a is caused to grow from the seed region 21S, the active layer 13b and the second semiconductor layer 13c are formed in this order on the first semiconductor layer 13a. The active layer 13b and the second semiconductor layer 13c are formed, for example, using a MOCVD method. Dislocation includes threading dislocation that extends in the vertical direction, and is formed throughout the entire semiconductor layer 13 formed in the seed region 21S. That is, the semiconductor layer 13 formed in the seed region 21S has an average dislocation density higher than the average dislocation density of the other portion of the semiconductor layer 13.

Next, the second portion 13c-2 is formed in the second semiconductor layer 13c, as illustrated in FIG. 3A. The second portion 13c-2 is formed, for example, by implantation of boron (B) ion in a portion of the second semiconductor layer 13c in the thickness direction. At this time, the second semiconductor layer 13c other than the second portion 13c-2 becomes the first portion 13c-1. In the present embodiment, an opening of the second portion 13c-2, namely, the first portion 13c-1 is formed in a region spaced apart from the seed region 21S (high dislocation portion 13H) in plan view. In this manner, the light emitting region E is formed outside the high dislocation portion 13H of the first semiconductor layer 13a in plan view.

After the second portion 13c-2 is formed in the second semiconductor layer 13c, the second electrode 14c and the pad electrode 15 are formed in this order, as illustrated in FIGS. 3B and 3C. Specifically, the formation is performed in the following manner. First, a conductive film 14 including, for example, a transparent conductive material is formed on the second semiconductor layer 13c (FIG. 3B). Then, patterning is performed to this conductive film 14 to form the second electrode 14c. The conductive film 14 is formed, for example, using a PVD (Physical Vapor Deposition) method such as vacuum deposition and sputtering. For example, photo lithography and etching are used to perform patterning to the conductive film 14. Alternatively, a lift-off method may be used to perform patterning to the conductive film 14. After the second electrode 14c is formed, for example, a metal film is form from above the second electrode 14c to above the second semiconductor layer 13c. After this, patterning is performed to this metal film to form the pad electrode 15.

After the pad electrode 15 is formed, the first electrode 14a is formed, as illustrated in FIG. 3D. After etching is performed to remove a portion of the second semiconductor layer 13c and a portion of the active layer 13b to expose the first semiconductor layer 13a, the first electrode 14a is formed on the exposed first semiconductor layer 13a.

Next, the second light reflecting layer 16 is formed on the second electrode 14c, as illustrated in FIG. 4A. The second light reflecting layer 16 is formed such that, for example, silicon oxide ($SiO_2$) and tungsten oxide ($Ta_2O_5$) are alternately formed in the form of film so as to cover the second electrode 14c and the pad electrode 15, and then, patterning is performed to these films.

After this, a support substrate 22 is bonded to the growth substrate 21 so that the support substrate 22 is opposed to the growth substrate 21 with the second light reflecting layer 16 being disposed therebetween, as illustrated in FIG. 4B. For the support substrate 22, it is possible to use, for example, a silicon (Si) substrate. For example, an adhesive is used at the time of bonding the support substrate 22 to the growth substrate 21. This adhesive includes, for example, a heat resistant resin material.

Next, top and bottom are flipped over as illustrated in FIG. 4C, and the growth substrate 21 is removed from the first semiconductor layer 13a. For example, an excimer laser is emitted selectively toward the vicinity of the seed region 21S to remove the growth substrate 21 from the first semiconductor layer 13a. One reason for this is that the low-temperature buffer layer having a low crystallinity exists in the seed region 21S, and this low-temperature buffer layer absorbs energy of the excimer laser to melt. The first semiconductor layer 13a other than the seed region 21S is so provided as to be spaced apart from the growth substrate 21. Thus, it is only necessary to remove the first semiconductor layer 13a in the seed region 21S from the growth substrate 21. It is preferable to emit the excimer laser so as to form a line-shape beam in accordance with the arrangement of the seed region 21S in a stripe shape.

After the growth substrate 21 is removed from the first semiconductor layer 13a, the first light reflecting layer 12 and the metal layer 17 are formed as illustrated in FIGS. 5A and 5B. Specifically, the formation is performed in the following manner. First, a dielectric film 12M, for example, in which silicon oxide (SiO2) and tantalum oxide (Ta2O5) are alternately formed in the form of film is formed on the first semiconductor layer 13a (on the surface opposite to the active layer 13b) (FIG. 5A). Then, patterning is performed to this dielectric film 12M to form a first light reflecting layer 12 in a region containing the light emitting region E. After this, the metal layer 17 is formed on the first semiconductor layer 13a (FIG. 5B).

After the first light reflecting layer 12 and the metal layer 17 are formed, the support substrate 11 is bonded so as to be opposed to the support substrate 22 with the first light reflecting layer 12 and the metal layer 17 being disposed therebetween, as illustrated in FIG. 5C. The support substrate 11 is fused to the support substrate 22 using, for example, soldering.

Lastly, the support substrate 22 is removed from the support substrate 11 to obtain the laser device 1 illustrated in FIG. 1. The removal of the support substrate 22 from the support substrate 11 is performed, for example, using laser emission with excimer laser and dry etching.

[Operation]

In this laser device 1, in a case where a predetermined voltage is applied across the first electrode 14a and the second electrode 14c, a current enters the active layer 13b, and emission of light is performed through electron-hole recombination. This light is reflected between the first light reflecting layer 12 and the second light reflecting layer 16, and goes and returns between these layers to generate laser oscillation. The light is taken out as laser light from the second light reflecting layer 16 side. The laser light is, for example, light having a wavelength in an ultraviolet range or in a visible range.

[Workings and Effects]

In the laser device 1 according to the present embodiment, the light emitting region E is provided at a position that is spaced apart from the high dislocation portion 13H of the first semiconductor layer 13a in plan view. Thus, light is emitted in a manner that substantially does not receive any influence of the high dislocation portion 13H. This will be described below.

For example, with VCSEL using a GaAs-based material, it is possible to form a semiconductor layer and a light reflecting layer using an epitaxial growth method. In a case of the epitaxial growth method, it is possible to adjust the thickness in the order of several nm. Thus, it is possible to easily manufacture a laser device having a high device characteristic.

On the other hand, in a case of VCSEL including a nitride-based semiconductor material, it is difficult to use epitaxial growth to form a light reflecting layer. Such a disadvantage in terms of a manufacturing method may lead to a deterioration in a device characteristic of the VCSEL including the nitride-based semiconductor material.

FIG. 6 is a diagram illustrating an example (comparative example) of a method of forming the VCSEL including the nitride-based semiconductor material. For example, a first light reflecting layer 112 is first formed on a growth substrate 121. The growth substrate 121 is, for example, a sapphire substrate. Then, a semiconductor layer 113 including a nitride semiconductor material is formed on this first light reflecting layer 112 using an ELO method. After that, a buffer layer 13f, a first semiconductor layer 13a, an active layer 13b, a second semiconductor layer 13c, and a contact layer 13e are formed in this order on the semiconductor layer 113.

As the VCSEL is formed as described above, the semiconductor layer 113 grows in the lateral direction in a state of being in contact with the first light reflecting layer 112. Thus, the direction of crystallographic axis of the semiconductor layer 113 is likely to incline. The crystallographic axis of the second light reflecting layer 16 formed on the semiconductor layer 113 also inclines, which reduces efficiency of combining the paired light reflecting layers (the first light reflecting layer 112 and the second light reflecting layer 16). This reduction in the efficiency of the combination may lead to a deterioration in a device characteristic.

Furthermore, at the time of causing the semiconductor layer 113 to grow, heating is performed to a temperature of, for example, 1000° C. or higher. Thus, there is a possibility that heating at this high temperature deteriorates the first light reflecting layer 112. In addition, this may also deteriorate a device characteristic.

Furthermore, it is possible to use a gallium nitride (GaN) substrate as the growth substrate 121. It is possible to consider that this growth substrate 121 is polished into a thin membrane, and the growth substrate 121 in the form of thin membrane is used as a portion of the semiconductor layer 113. However, in a case of polishing, it is difficult to precisely adjust the thickness in the order of μm, and a resonator length becomes long. Thus, diffraction loss resulting from expansion of light is likely to occur.

Furthermore, the gallium nitride (GaN) substrate that is used as the growth substrate 121 is expensive. In addition, the diameter of available gallium nitride (GaN) substrate is small, and is, for example, two inches or less. Thus, use of a gallium nitride (GaN) substrate as the growth substrate 121 is disadvantage in terms of cost.

On the other hand, a sapphire substrate is inexpensive. In addition, in a case of the sapphire substrate, it is possible to easily obtain a substrate having a large diameter (for example, four inches). However, in a case where a nitride semiconductor material is caused to grow on the sapphire substrate through a low-temperature buffer layer, the dislocation density of this semiconductor layer, which is about $1 \times 10^9$ cm$^{-2}$, is higher than that obtained using a gallium nitride (GaN) substrate. This high dislocation density is allowable in LED (light Emitting Diode). However, in a case of the VCSEL, this high dislocation density has an influence on the reliability of the device. One reason for this is that the VCSEL drives at a current density higher than that of the LED.

On the contrary, in a case of the laser device 1, although the first semiconductor layer 13a includes the high dislocation portion 13H, the light emitting region E is provided outside this high dislocation portion 13H in plan view. This makes it possible for the laser device 1 to emit light in a manner that substantially does not receive any influence of the high dislocation portion 13H.

Furthermore, no mask layer (mask layer 122 in FIGS. 6A and 6B) is used. Thus, the crystallographic axis of the semiconductor layer 13 does not incline. In addition, deterioration of the first light reflecting layer 12 or the second light reflecting layer 16 due to high temperatures does not occur.

Furthermore, the semiconductor layer 13 is formed using an ELO method. Thus, it is possible to adjust the thickness thereof in the order of μm. That is, it is possible to form a semiconductor layer 13 having a reduced thickness.

In addition, with a lateral growth technique, the first semiconductor layer 13a is caused to grow using the growth substrate 21 including the recessed portion 21R. Thus, the dislocation density of the first semiconductor layer 13a other than the seed region 21S is reduced. This allows use of a sapphire substrate for the growth substrate 21.

As described above, in the present embodiment, the light emitting region E is provided outside the high dislocation portion 13H of the first semiconductor layer 13a. Thus, it is possible to suppress the influence of the high dislocation portion 13H on the light emitting region E. This makes it possible to improve a device characteristic such as reliability.

Furthermore, formation is performed without using any mask layer (the mask layer 122 in FIGS. 6A and 6B). Thus, it is possible to suppress a deterioration of device characteristic resulting from the mask layer.

In addition, using an ELO method, it is possible to form the semiconductor layer 13 having a thickness of 10 μm or less. Thus, it is possible to reduce occurrence of a diffraction loss resulting from expansion of light, which makes it possible to suppress a deterioration in device characteristic.

Moreover, the semiconductor layer 13 is formed using a lateral growth technique that employs a seed crystal. Thus, it is possible to use a sapphire substrate for the growth substrate 21. This makes it possible to suppress the manufacturing cost of the laser device 1.

Application Example

It is possible to apply the laser device 1 according to the present technology to an electronic apparatus such as a display or an illuminating unit, for example.

The present technology has been described with reference to the embodiments. However, the present technology is not limited to the embodiments described above, and various modifications are possible. For example, the constituent elements, the arrangement, the number, or the like of the laser device 1 given as examples in the embodiments described above are merely examples. The laser device 1 does not have to include all the constituent elements. In addition, the laser device 1 may further include other constituent elements.

It should be noted that the effects described in the present description are merely examples. Other effects may be achieved.

It should be noted that the present technology is able to have the following configurations.

(1)

A surface emitting laser including:

a semiconductor layer containing a nitride semiconductor, and including a first semiconductor layer, an active layer, and a second semiconductor layer that are stacked in this order, the semiconductor layer including a light emitting region; and a first light reflecting layer and a second light reflecting layer that are opposed to each other with the semiconductor layer being disposed therebetween, the first semiconductor layer having a high dislocation portion disposed outside the light emitting region, the high dislocation portion having an average dislocation density higher than an average dislocation density of the light emitting region.

(2)

The surface emitting laser according to (1) described above, further including a first electrode and a second electrode that are directed to application of a voltage to the semiconductor layer.

(3)

The surface emitting laser according to (2) described above, in which the second electrode includes a light-transmissive electrically conductive material.

(4)

The surface emitting laser according to any one of (1) to (3) described above, further including a support substrate, in which the first light reflecting layer, the first semiconductor layer, the active layer, the second semiconductor layer, and the second light reflecting layer are provided in an order from a position close to the support substrate.

(5)

The surface emitting laser according to (5) described above, in which the support substrate includes a silicon (Si) substrate.

(6)

The surface emitting laser according to any one of (1) to (5) described above, in which the first semiconductor layer and the second semiconductor layer contain GaN, and the active layer contains InGaN.

(7)

The surface emitting laser according to any one of (1) to (6) described above, in which the second semiconductor layer includes a first portion that is opposed to the light emitting region, and a second portion that is higher in electric resistance than the first portion.

(8)

The surface emitting laser according to (7) described above, in which the second portion contains a boron (B) ion.

(9)

The surface emitting laser according to any one of (1) to (8) described above, in which a sum of thicknesses of the first semiconductor layer, the active layer, and the second semiconductor layer is 10 µm or less.

(10)

A method of manufacturing a surface emitting laser, the method including:

forming a first semiconductor layer in a seed region selectively provided in a growth substrate;

stacking an active layer and a second semiconductor layer in this order on the first semiconductor layer, after causing the first semiconductor layer to grow, from the seed region, in a direction parallel to a plane of the growth substrate;

forming a light emitting region outside the seed region;

forming a second light reflecting layer that is opposed to the active layer with the second semiconductor layer being disposed therebetween;

removing the growth substrate, after bonding a first support substrate to the growth substrate with the second light reflecting layer being disposed therebetween; and forming a first light reflecting layer that is opposed to the second light reflecting layer with the active layer being disposed therebetween.

(11)

The method of manufacturing the surface emitting laser according to (10) described above, in which, upon causing the first semiconductor layer to grow from the seed region, a portion of the first semiconductor layer other than the seed region so grows as to be spaced apart from the growth substrate.

(12)

The method of manufacturing the surface emitting laser according to (10) or (11) described above, in which the first semiconductor layer in the seed region is formed by etching of the first semiconductor layer formed on the growth substrate.

(13)

The method of manufacturing the surface emitting laser according to (12) described above, in which the growth substrate is etched together with the etching of the first semiconductor layer.

(14)

The method of manufacturing the surface emitting laser according to any one of (10) to (13) described above, in which, in the seed region, the first semiconductor layer has an average dislocation density higher than an average dislocation density of the light emitting region.

(15)

The method of manufacturing the surface emitting laser according to any one of (10) to (14) described above, in which the growth substrate is removed through emission of an excimer laser.

(16)

The method of manufacturing the surface emitting laser according to any one of (10) to (15) described above, further including removing the first support substrate, after bonding a second support substrate that is opposed to the first support substrate with the first light reflecting layer being disposed therebetween.

(17)

The method of manufacturing the surface emitting laser according to (16) described above, in which the growth substrate includes a sapphire substrate, and the first support substrate and the second support substrate include a silicon (Si) substrate.

The present application claims priority based on Japanese Patent Application No. 2017-120071 filed with the Japan Patent Office on Jun. 20, 2017, the entire contents of which are incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. A surface emitting laser comprising:
a semiconductor layer that contains a nitride semiconductor, and that includes a first semiconductor layer, an active layer, and a second semiconductor layer that are stacked in this order, wherein the semiconductor layer includes a light emitting region;
a first light reflecting layer and a second light reflecting layer that are opposed to each other with the semiconductor layer disposed therebetween;
a support substrate; and
a metal layer that is disposed between the support substrate and the first semiconductor layer, wherein:
the metal layer surrounds the first light reflecting layer, and is provided on a same layer as the first light reflecting layer on the support substrate,
the first semiconductor layer has a high dislocation portion disposed outside the light emitting region, and
the high dislocation portion has an average dislocation density higher than an average dislocation density of the light emitting region.

2. The surface emitting laser according to claim 1, further comprising a first electrode and a second electrode that are directed to application of a voltage to the semiconductor layer, wherein the second electrode is in the light emitting region and the first electrode is at a position that is positionally shifted from the light emitting region, and wherein the first semiconductor layer and the metal layer are disposed between the first electrode and the support substrate.

3. The surface emitting laser according to claim 2, wherein the second electrode includes a light-transmissive electrically conductive material.

4. The surface emitting laser according to claim 1, wherein the first light reflecting layer, the first semiconductor layer, the active layer, the second semiconductor layer, and the second light reflecting layer are provided in an order from a position close to the support substrate.

5. The surface emitting laser according to claim 1, wherein the support substrate comprises a silicon (Si) substrate.

6. The surface emitting laser according to claim 1, wherein the first semiconductor layer and the second semiconductor layer contain GaN, and the active layer contains InGaN.

7. The surface emitting laser according to claim 1, wherein the second semiconductor layer includes a first portion that is opposed to the light emitting region, and a second portion that is higher in electric resistance than the first portion.

8. The surface emitting laser according to claim 7, wherein the second portion contains a boron (B) ion.

9. The surface emitting laser according to claim 1, wherein a sum of thicknesses of the first semiconductor layer, the active layer, and the second semiconductor layer is 10 μm or less.

10. The surface emitting laser according to claim 2, further comprising a pad electrode that is provided from above the second electrode to above the semiconductor layer, wherein the pad electrode includes an opening that exposes the second electrode in the light emitting region.

11. The surface emitting laser according to claim 2, wherein the active layer and the second semiconductor layer each has an opening, wherein the opening in the active layer and the opening in the second semiconductor layer overlap with each other and expose the first semiconductor layer, and wherein the first electrode is in contact with a portion of the first semiconductor layer that is exposed.

12. The surface emitting laser according to claim 1, wherein a thickness of the metal layer is same as a thickness of the first light reflecting layer.

13. A method of manufacturing a surface emitting laser, the method comprising:
  forming a first semiconductor layer in a seed region selectively provided in a growth substrate, wherein the first semiconductor layer in the seed region is formed by etching of the first semiconductor layer formed on the growth substrate;
  stacking an active layer and a second semiconductor layer in this order on the first semiconductor layer, after causing the first semiconductor layer to grow, from the seed region, in a direction parallel to a plane of the growth substrate
  forming a light emitting region outside the seed region;
  forming a second light reflecting layer that is opposed to the active layer with the second semiconductor layer being disposed therebetween;
  removing the growth substrate, after bonding a first support substrate to the growth substrate with the second light reflecting layer being disposed therebetween; and
  forming a first light reflecting layer that is opposed to the second light reflecting layer with the active layer being disposed therebetween.

14. The method of manufacturing the surface emitting laser according to claim 13, wherein, upon causing the first semiconductor layer to grow from the seed region, a portion of the first semiconductor layer other than in the seed region is spaced apart from the growth substrate.

15. The method of manufacturing the surface emitting laser according to claim 13, wherein the growth substrate is etched together with the etching of the first semiconductor layer.

16. The method of manufacturing the surface emitting laser according to claim 13, wherein, in the seed region, the first semiconductor layer has an average dislocation density higher than an average dislocation density of the light emitting region.

17. The method of manufacturing the surface emitting laser according to claim 13, wherein the growth substrate is removed through emission of an excimer laser.

18. The method of manufacturing the surface emitting laser according to claim 13, further comprising removing the first support substrate, after bonding a second support substrate that is opposed to the first support substrate with the first light reflecting layer being disposed therebetween.

19. The method of manufacturing the surface emitting laser according to claim 18, wherein the growth substrate comprises a sapphire substrate, and the first support substrate and the second support substrate comprise a silicon (Si) substrate.

* * * * *